(12) United States Patent
Banine et al.

(10) Patent No.: US 7,772,570 B2
(45) Date of Patent: Aug. 10, 2010

(54) ASSEMBLY FOR BLOCKING A BEAM OF RADIATION AND METHOD OF BLOCKING A BEAM OF RADIATION

(75) Inventors: Vadim Yevgenyevich Banine, Helmond (NL); Vladimir Vitalevich Ivanov, Moscow (RU); Konstantin Nikolaevich Koshelev, Troitsk (RU); Vladimir Mihailovitch Krivtsun, Troitsk (RU)

(73) Assignee: ASML Netherlands B.V., Veldhoven (NL)

( * ) Notice: Subject to any disclaimer, the term of this patent is extended or adjusted under 35 U.S.C. 154(b) by 756 days.

(21) Appl. No.: 11/643,954

(22) Filed: Dec. 22, 2006

(65) Prior Publication Data

US 2008/0148978 A1 Jun. 26, 2008

(51) Int. Cl.
*A61N 5/00* (2006.01)
(52) U.S. Cl. .............................. 250/492.2; 250/504 R; 101/471
(58) Field of Classification Search ............... 250/492.2
See application file for complete search history.

(56) References Cited

U.S. PATENT DOCUMENTS 3,517,196 A * 6/1970 Owens .................... 250/201.1
5,155,367 A * 10/1992 Han .......................... 250/372
5,363,199 A * 11/1994 Victor et al. ................. 356/439
7,087,907 B1 * 8/2006 Lalovic et al. ............ 250/461.1
2005/0269529 A1* 12/2005 Ershov et al. ............ 250/504 R

FOREIGN PATENT DOCUMENTS

| EP | 1 526 550 A1 | 4/2005 |
|---|---|---|
| WO | 02/093254 A1 | 11/2002 |
| WO | 2005/017624 A1 | 2/2005 |
| WO | 2006/049886 A2 | 5/2006 |

OTHER PUBLICATIONS

International Search Report dated Feb. 28, 2008 for International Application No. PCT/NL2007/050604.

* cited by examiner

*Primary Examiner*—David A. Vanore
*Assistant Examiner*—Phillip A. Johnston
(74) *Attorney, Agent, or Firm*—Pillsbury Winthrop Shaw Pittman LLP

(57) ABSTRACT

An assembly is provided for blocking a beam of radiation. The assembly has a pipe arranged to transmit at least part of the beam of radiation. The pipe has an inner surface provided with an ablation material and encloses a volume. The assembly further has an ablation generation device. The ablation generation device is arranged to ablate at least a portion of the ablation material upon reception of a blocking signal. The assembly has a control unit, which is arranged to control the ablation generation device.

22 Claims, 7 Drawing Sheets

ASSEMBLY FOR BLOCKING A BEAM OF RADIATION AND METHOD OF BLOCKING A BEAM OF RADIATION

FIELD

The present invention relates to an assembly for blocking a beam of radiation, and a lithographic apparatus comprising such an assembly. The invention further relates to an arrangement comprising a plurality of such assemblies. The invention further relates to a method of blocking a beam of radiation. Finally, the invention relates to a computer program product for performing, when executed by a processor, such a method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The demand for smaller and smaller semiconductor devices drives the need to have lithographic fabrication processes achieve pattern features and profiles having smaller critical dimensions. One of the limitations of present-day lithographic apparatus relates to the number of photons that controllably reach the substrate. Sources in lithographic apparatus are pulsed lasers producing radiation with a certain pulse frequency and pulse length. Consequently, the minimum number of photons incident on the substrate corresponds to the number of photons within a single pulse.

SUMMARY

It is desirable to provide a device and a method for limiting the number of photons incident on the substrate below the number of photons within a single source pulse in a controllable way.

To that end, the invention provides an assembly for blocking a beam of radiation, the assembly comprising:
 a pipe arranged to transmit at least part of the beam of radiation, the pipe comprising an inner surface, the inner surface comprising an ablation material and enclosing a volume;
 an ablation generation device arranged to ablate at least a portion of the ablation material upon reception of a blocking signal;
 a control unit arranged to control the ablation generation device.

Additionally, in an embodiment, the invention provides an arrangement comprising a plurality of aforementioned assemblies, wherein the assemblies are arranged in a matrix format.

Additionally, in an embodiment, the invention provides a lithographic apparatus comprising:
 an illumination system configured to provide a beam of radiation;
 a support structure configured to support a patterning device that serves to impart the beam of radiation with a pattern in its cross-section;
 a substrate holder configured to hold a substrate;
 a projection system configured to expose the patterned beam on the substrate;
 wherein the lithographic apparatus further comprises at least one such assembly.

Additionally, in an embodiment, the invention provides a method of blocking a beam of radiation, the method comprising:
 providing an assembly comprising a pipe comprising an inner surface that comprises an ablation material and encloses a volume, an ablation generation device, and a control unit arranged to connect with the ablation generation device;
 providing a beam of radiation such that at least part of it is transmitted through the pipe;
 transmitting a blocking signal from the control unit towards the ablation generation device;
 generating ablation of the ablation material in the pipe by the ablation generation device in response to the blocking signal received from the control unit.

Finally, in an embodiment, the invention provides a computer program product for performing, when executed by a processor, such a method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
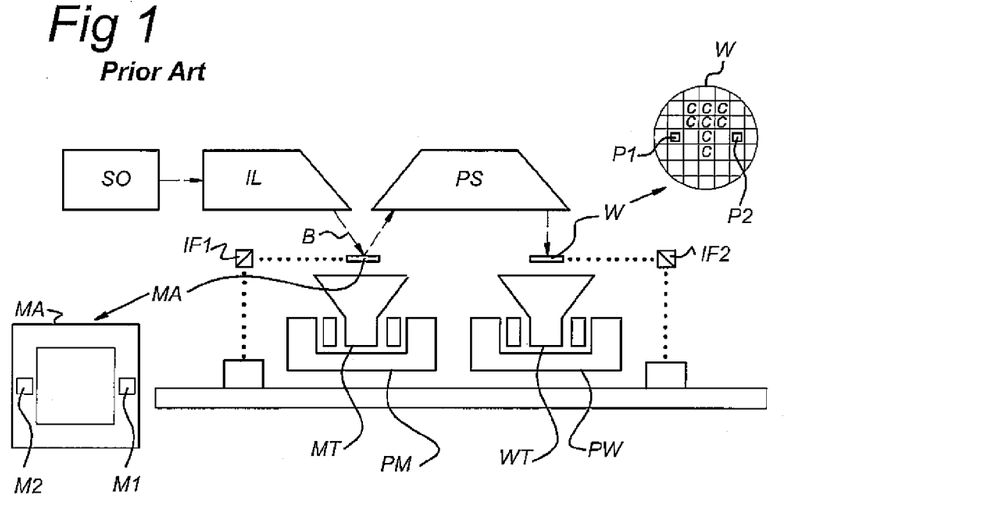
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV-radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
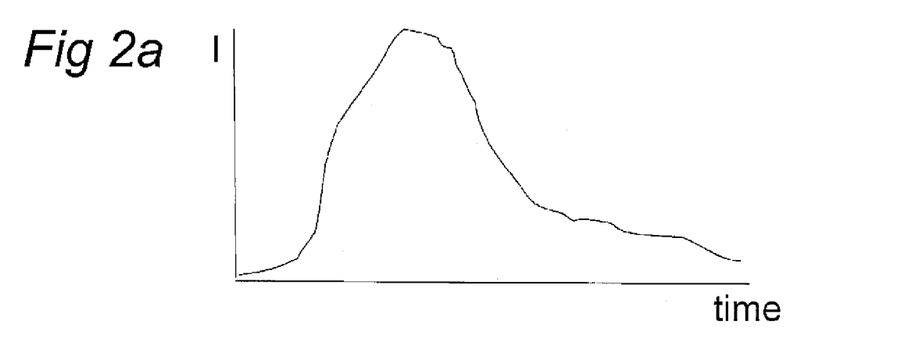
FIG. 2a shows an intensity profile of an EUV radiation pulse as a function of time without employment of an embodiment of the present invention.
Figure 2B:
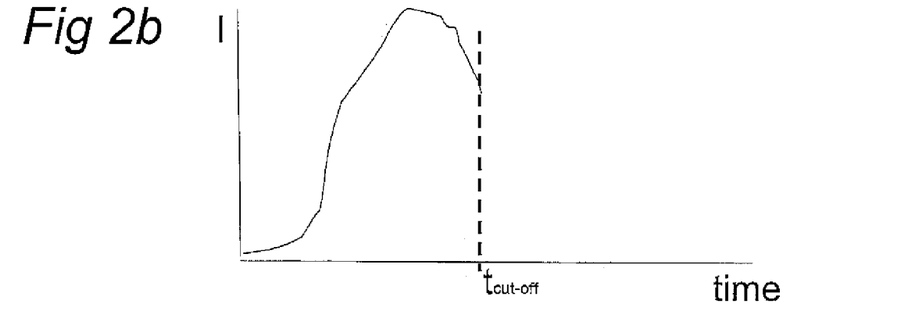
FIG. 2b shows an intensity profile of an EUV radiation pulse as a function of time with employment of an embodiment of the present invention.

FIG. 2a shows an intensity profile of an EUV radiation pulse as a function of time without employment of an embodiment of the present invention. A typical pulse length of EUV-radiation is 30-100 ns. As can be clearly seen, the intensity profile of the radiation pulse varies over time. However, it turns out that the pulse length and pulse shape of the radiation pulse is substantially constant over time. Integration of a single radiation pulse yields the number of photons per pulse. This information is employed in embodiments of the invention. FIG. 2b shows an intensity (I) profile of an EUV radiation pulse as a function of time with employment of an embodiment of the present invention. As compared to the intensity profile depicted in FIG. 2a, the pulse is cut off. In embodiments of the invention, the cut-off point, $t_{cut-off}$, is selected to transmit a preselected number of photons, the preselected number of photons being less than the number of photons present in the entire radiation pulse depicted in FIG. 2a.

Figure 3:
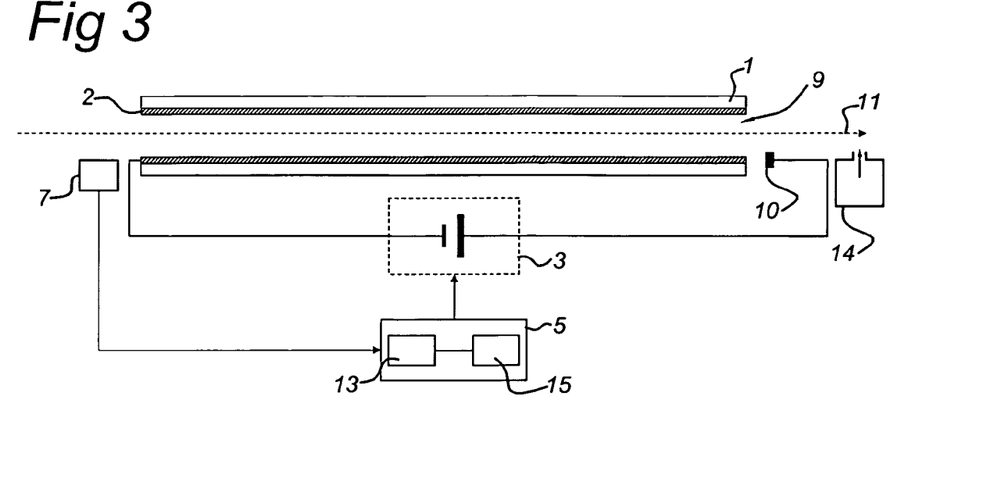
FIG. 3 shows a cross-sectional view of an assembly for blocking a beam of radiation according to a first embodiment of the present invention.

FIG. 3 shows a cross-sectional view of an assembly for blocking a beam of radiation according to a first embodiment of the present invention. The assembly comprises a pipe 1, a power supply 3 and a control unit 5. The term "pipe" as used herein is not limited to a structure with an entirely closed inner surface, like a tube, but may also refer to a number of side walls in close proximity to each other such that a volume is enclosed. In the latter case the surface of one side wall "facing" other side walls is referred to as the inner surface. The pipe may have a substantially circular cross-sectional shape, but may also have another polygon cross-sectional shape e.g. a hexagonal honeycomb structure.

The pipe 1 comprises an inner surface that comprises an ablation material, e.g. in the form of a layer 2. Suitable ablation materials that may be used in embodiments of the present invention include solid ammonia ($NH_3$), Xenon (Xe), Tin (Sn) and Zinc (Zn). The inner surface of the pipe 1 encloses a volume 9. In an embodiment, the pipe 1 has a diameter of 10-200 µm and a length of 0.01-1 cm. The pipe 1 is arranged to transmit at least part of a beam of radiation, in FIG. 3 denoted with the dashed arrow 11. The power supply 3 is used as an ablation generation device, i.e. it is arranged to ablate at least part of the ablation material present on the inner surface of the pipe 1. The power supply 3 may be connected to the pipe 1 at one position, i.e. at one end like the left end in FIG. 3, and serves as one pole of the power supply 3, i.e. in this case a cathode. The other pole of the power supply 3, i.e. an anode, is connected with an electrode 10 located at a different position in close proximity, but not connected to the pipe 1. If the power supply 3 provides a voltage that exceeds a certain threshold value, a discharge is generated, resulting in an energy burst that is high enough to enable ablation of material from the inner surface into the volume 9.

The power supply 3 is connected to and may be controlled by the control unit 5.

The control unit 5 comprises a processor 13 and a memory 15 which, in an embodiment, are connected with each other. In an embodiment, processor 13 and memory 15 are arranged to communicate with each other. The processor 13 may be arranged to calculate the moment in time on which and/or the period over which the power supply 3 provides aforementioned voltage exceeding aforementioned threshold value. In such calculation, data stored in the memory 15 may be used, which information may be inserted via an input terminal (not shown) or the like, e.g. by an operator. Memory 15 may comprise programming lines readable and executable by a processor, e.g. processor 13, to provide the processor with a functionality according to a least one of the embodiments described in this application. Note that, although only one processor 13 and one memory 15 are depicted, embodiments of the invention may also comprise a control unit 5 comprising more than a single processor 13 and/or a single memory 15.

In operation, the assembly works as follows. If it is desired to block at least part of the beam of radiation that is directed through the pipe 1, the control unit 5 may transmit a blocking signal towards the ablation generation device, i.e. power supply 3. In response to the blocking signal, the power supply 3 provides a voltage that exceeds aforementioned threshold, and a discharge is generated. The discharge causes ablation material to ablate into the volume 9. The ablation material in gaseous form in the volume 9 forms a barrier for the beam of radiation proceeding through the pipe 1. If the beam of radiation is EUV radiation or the like, such a barrier will almost immediately be opaque for the radiation. Consequently, for an observer at the end of the pipe 1 through which the radiation normally would leave the pipe 1 the light is suddenly "switched off". The ablation material gas barrier in the pipe 1 thus forms a light switch. The dissipation of the gas of ablation material in the volume 9 of the pipe 1 is sonic, and therefore takes only 1-10 ns. As already several mbar*cm of material is enough to absorb EUV-radiation effectively, it turns out that such a solid state light switch can switch a beam of radiation, e.g. EUV-radiation, within 3-30 ns depending on the pipe cross-sectional dimensions and sound velocity of the ablation material. As the typical pulse length of a light pulse of EUV-radiation is 30-100 ns, long EUV-pulses may be cut off. In embodiments in which the pipe length is much larger than the pipe diameter, e.g. an aspect ratio of 1000:1, i.e. a pipe diameter of 10 μm and a pipe length of 10 mm, the gas of ablation material will effectively return to the inner surface of the pipe 1, and not leave the pipe 1 after the power supply 3 has been switched off. As a result, etching of the inner surface of the pipe is limited.

In an embodiment, the assembly further comprises a detector 7. The detector 7 is arranged to detect the at least part of the beam of radiation, and is connected to the control unit 5. In order to be able to cut off the pulse length of the radiation pulse itself, as depicted in FIG. 2b, the switch-off operation may be synchronized with the pulsed radiation. The detector 7 is arranged to detect the radiation pulse at a certain location within or with respect to the pipe 1, and transmits a detection signal towards the control unit 5 upon detection. In response to the detection signal received, the control unit 5 may transmit a blocking signal towards the ablation generation device, i.e. the power supply 3 in connection to the cathode and anode.

The control unit 5 may wait a certain time Δt before transmitting the blocking signal, Δt depending on the desired cut-off point in the pulse, and the time it takes to detect the radiation pulse, the time it takes to send the detection signal from the detector 7 towards the control unit 5, the time it takes to send the blocking signal from the control unit 5 towards the ablation generation device. This operation may be performed by the processor 13 in conjunction with the memory 15 in the control unit 5. In that case, information with respect to the desired cut-off point within a radiation pulse may be stored in the memory 15, as well as information with respect to the time it takes to detect and transmit the detection signal as well as the time it takes to transmit a blocking signal. Based on this information stored in the memory 15, the processor 13 may calculate a time Δt. The control unit 5 then waits a period of Δt before a blocking signal is transmitted in response to receipt of the detection signal.

In response to the blocking signal, the ablation generation device triggers the switch, i.e. the power supply 3 causes a fast discharge, i.e. 1-2 ns, such that material is ablated within the pipe 1, the ablation material herewith forming an ablation material gas barrier.

As mentioned earlier, if the position of the detector 7 with respect to the pipe 1, the time for transmitting the blocking signal from the detector 7 towards the control unit 5, the time for processing of the reception of the blocking signal and corresponding transmitting of the blocking signal towards the power supply 3, as well as the time it takes for the power supply 3 to generate the ablation material gas barrier are known in advance, a very reliable light switch may be formed. If accurately dimensioned, aforementioned switching time within 3-30 ns for switching an EUV-radiation beam on and off may be reached. Such a performance may enable a control of the number of photons in a beam of radiation being transmitted through pipe 1.

In an embodiment, the volume 9 is at least partly filled with a gas, i.e. a so-called starting gas, provided by means of a gas supply 14. The starting gas may serve as an aid to generate the discharge causing the ablation of the ablation material in the pipe 1. Gases that are suitable as a starting gas include Helium (He), Argon (Ar), Hydrogen ($H_2$) and Nitrogen ($N_2$).

In an alternative embodiment, a small amount of ablation material is ablated by providing a small energy with an additional power supply (not shown) so as to ablate an amount of ablation material which is low enough not to affect radiation transparency in volume 9. In case of receipt of a blocking signal, the power supply 3 causes a fast increase of the current in the volume 9 resulting in generation of the ablation material gas barrier as described before. In this embodiment, jitter caused by the discharge may be decreased.

Figure 4:
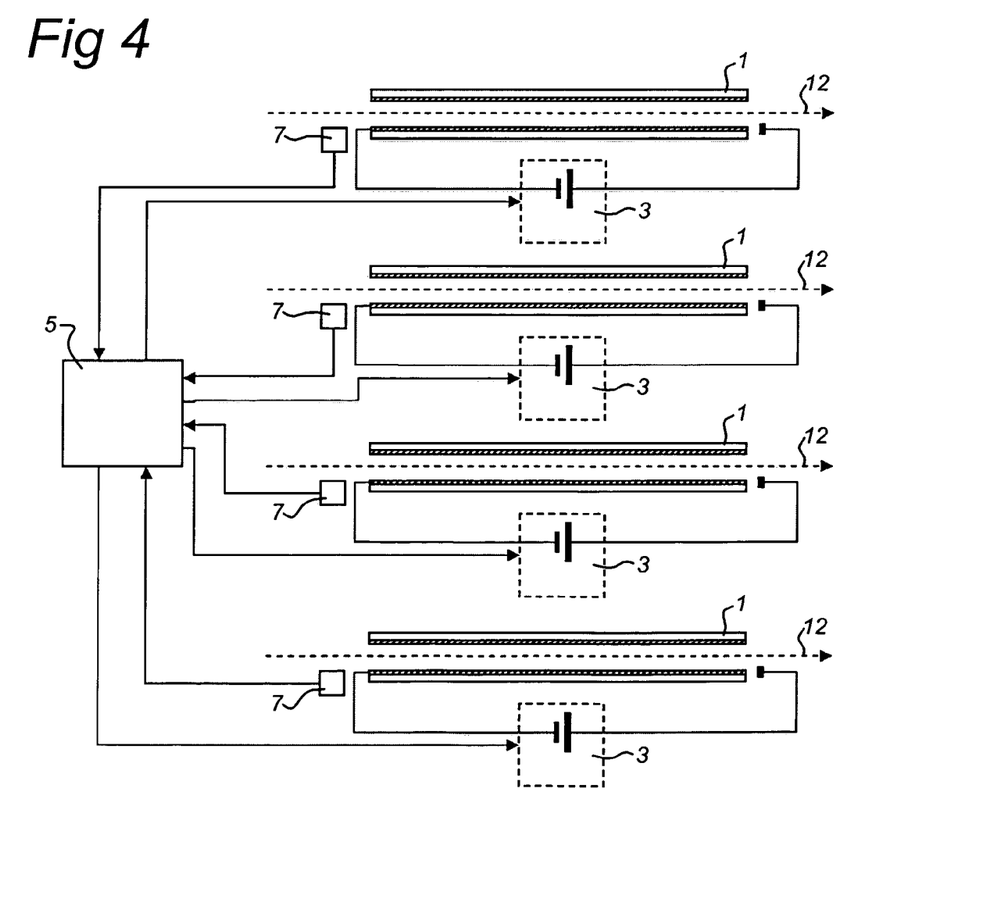
FIG. 4 shows a plurality of assemblies as shown in FIG. 3.

FIG. 4 shows a plurality of assemblies as shown in FIG. 3. Each assembly comprises a pipe 1 and an ablation generation device, i.e. a power supply 3. In an embodiment, each pipe 1 is arranged to transmit part of a beam of radiation, i.e. a sub-beam, in FIG. 4 denoted with the dashed arrows 12. It must be understood that in alternative embodiments several assemblies may share an ablation generation device, i.e. a power supply 3. In that case, ablation in the pipes 1 present in the assemblies sharing an ablation generation device will be generated simultaneously upon receiving a blocking signal by the ablation generation device from the control unit 5.

In the embodiment of the plurality of assemblies shown in FIG. 4, all assemblies share a control unit 5. Moreover, the control unit 5 controls the operation of each assembly individually. However, it must be understood that, in alternative embodiments, it is also possible that each assembly is controlled individually by a separate control unit 5 or that several assemblies are controlled as a group by a single control unit 5. The latter may occur when several assemblies are connected to a single ablation generation device 3 that is connected to a single control unit 5.

In the embodiment of the plurality of assemblies shown in FIG. 4, all assemblies are provided with a detector 7. However, it must be understood that in embodiments of the invention arranged for the mere blocking of a beam of radiation, i.e. blocking between radiation pulses, the detectors 7 may not be present.

The assemblies may be arranged in some kind of matrix format, e.g. a one-dimensional matrix like a line as depicted in FIG. 4, or a 2-dimensional matrix like for example is used in multi-channel plates. The arrangement of the pipes 1 with respect to each other may be adapted to the particular circumstances of the situation at hand, e.g. the pipes 1 may be arranged in a squared (X-Y) pattern or, alternatively, in a hexagonal pattern.

The matrix format with optimal results may depend on the cross-sectional shape of the pipes 1. In case of a hexagonically shaped cross-section of the pipes, the matrix format may take the form of a honeycomb like matrix structure.

If pipes are arranged in a matrix format, a beam of radiation may be partially switched off and on. For example, if there are four pipes and each pipe is arranged to accommodate the transmission of a quarter of the beam of radiation, transmitting a blocking signal to one of the pipes will result in the transmission of three quarters of the beam of radiation. Similarly, transmitting four blocking signals simultaneously will result in the blocking of the radiation beam as a whole. In this way, the intensity of the beam of radiation may be controllable in a stepwise manner. Moreover, with a suitable spatial arrangement of the pipes 1, different illumination modes can be formed.

As mentioned earlier, all blocking signals may be transmitted by a single control unit 5. However, in other embodiments, each assembly uses its own control unit. If more than one pipe 1 is connected to an ablation generation device, i.e. a power supply 3, these pipes 1 will be switched on and off in correspondence with each other.

Embodiments of the assemblies arranged in a matrix of pipes may be used to provide a maskless lithography system. The matrix may then serve as a programmable patterning device, e.g. a spatial light modulator (SLM). The control unit 5 generates blocking signals in correspondence to at least one of light pulse period information, physical layout information and scanning speed of the object to be exposed. In this way the control unit 5 may transmit blocking signals to individual assemblies in a way corresponding to a physical layout to be exposed, enabling the exposure of that physical layout on a substrate. Simultaneously or alternatively, in case a beam of radiation is split into a number of sub-beams, and each sub-beam is arranged to be transmitted through an assembly part of the plurality of assemblies, the control unit may control the dose of the sub-beams, i.e. control the number of photons transmitted, to compensate for dose variations within the beam and/or change illumination modes of the beam of radiation and/or other purposes known to persons skilled in the art.

In comparison to the mere blocking of an entire beam or sub-beam of radiation, illumination modes or intensity profiles can be controlled in a more detailed way, i.e. in a more continuous manner.

Generally, the pipes 1 being part of the plurality of assemblies are positioned at a position where the beam of radiation, or, alternatively, the sub-beams of radiation arranged to be transmitted there through have a limited divergence, e.g. a beam divergence angle smaller than the aspect ratio, i.e. diameter: length, of the pipe(s) 1. As a result, loss of radiation due to the absorption or blocking by the physical structure of the plurality of assemblies is kept at a minimum.

If the plurality of assemblies is used to adapt characteristics of the beam of radiation with respect to one of the group comprising shape, illumination mode and local dose variations, the plurality of assemblies may be positioned in the optical pathway between the source and the substrate to be exposed before the patterning device, e.g. a reticle or mask. After all, it may be easier to adapt aforementioned characteristics before an image is formed.

Figure 5:
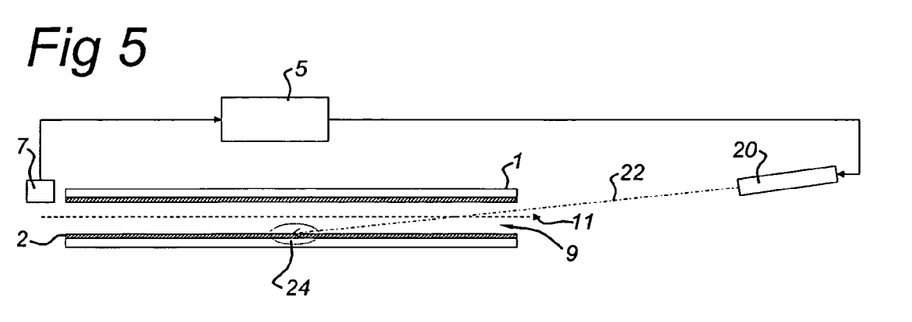
FIG. 5 shows an assembly for blocking a beam of radiation according to a second embodiment of the present invention.

FIG. 5 shows an assembly for blocking a beam of radiation according to a second embodiment of the present invention. The assembly again comprises a pipe 1, a control unit 5 and an ablation generation device. The direction of the beam of radiation through pipe 1 is again schematically depicted by dashed arrow 11.

In this embodiment, instead of the use of a power supply 3 arranged to provide a fast discharge between a cathode and an anode, the ablation generation device comprises a laser 20. The laser 20 is arranged to direct a laser beam 22 towards an area 24 located on the inner surface of the pipe such that the energy generated causes ablation of ablation material, which may be present in the form of a layer 2. In FIG. 5, the laser beam 22 is schematically depicted by the dashed-dotted arrow, while the area 24 is schematically depicted by the dotted oval. Again, the ablation material fills the volume 9 in the pipe 1 within a few ns, typically 1-10 ns, and forms an ablation material gas barrier therein that is opaque to certain types of radiation, i.e. EUV-radiation.

The control of the ablation generation device is again performed by control unit 5 in a way already explained with reference to FIG. 3.

It must be understood, that although not explicitly shown, also the embodiment of an assembly as depicted in FIG. 5, may be used in a plurality of assemblies like the one depicted in FIG. 4 with respect to the assembly of FIG. 3. In such a plurality of assemblies, one laser 20 per assembly may be used. However, it may also be possible that a single laser 20 is used as an ablation generation device for more than one pipe 1, e.g. by splitting a laser beam 22 in a number of laser sub-beams by optical techniques using optical components as known by persons skilled in the art.

FIG. 5 depicts an embodiment in which the assembly moreover comprises a detector 7. The structure and operation of the detector 7 is already explained with reference to FIG. 3.

Figure 6:
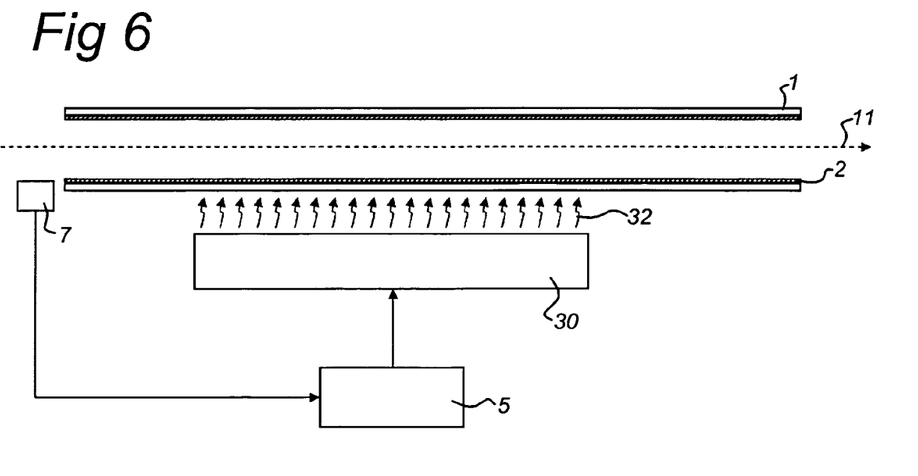
FIG. 6 shows an assembly for blocking a beam of radiation according to a third embodiment of the present invention.

FIG. 6 shows an assembly for blocking a beam of radiation according to a third embodiment of the present invention. The assembly again comprises a pipe 1, a control unit 5 and an ablation generation device. The direction of the beam of radiation through pipe 1 is again schematically depicted by a dashed arrow 11.

In this embodiment of the assembly, the ablation generation device is a heating device 30 arranged to dissipate a large amount of heat 32 in close proximity of a wall of the pipe 1 within a short period of time. In this embodiment the thickness of the wall is limited, i.e. less than, in order to absorb the heat fast enough. As a result of the fast heating, ablation of ablation material, e.g. present at the inner surface of the pipe 1 in the form of a layer 2, takes place, which may again result in the formation of an ablation material gas barrier.

The control of the ablation generation device is again performed by control unit 5 in a way already explained with reference to FIG. 3.

FIG. 6 depicts an embodiment in which the assembly moreover comprises a detector 7. The structure and operation of the detector 7 is already explained with reference to FIG. 3.

Again, it must be understood, that although not explicitly shown, also the embodiment of an assembly as depicted in FIG. 6, may be used in a plurality of assemblies in a similar way as depicted in FIG. 4 with respect to the assembly of FIG. 3.

It must be understood that embodiments of the invention are also arranged to terminate the blocking of said beam of radiation by means of an ablation gas barrier in one or more pipes 1. Termination by said blocking may be achieved by switching off the ablation generation device. For this purpose, the control unit 5 may send a terminating signal towards the ablation generation device. In response to receipt of the terminating signal the ablation generation device switches off. So in case a power supply 3 is used as ablation generation device, the power is switched of. As a result the gas of ablation material will effectively return to the inner surface of the pipe 1. Generally, the terminating signal is sent after passage of a pulse of radiation in such a way that the pipe is "open" for a subsequent radiation pulse. In an embodiment of the assembly comprising a detector, the terminating signal may be sent by the control unit in response to the reception of a signal from the detector that it does not detect a radiation pulse anymore.

Figure 7:
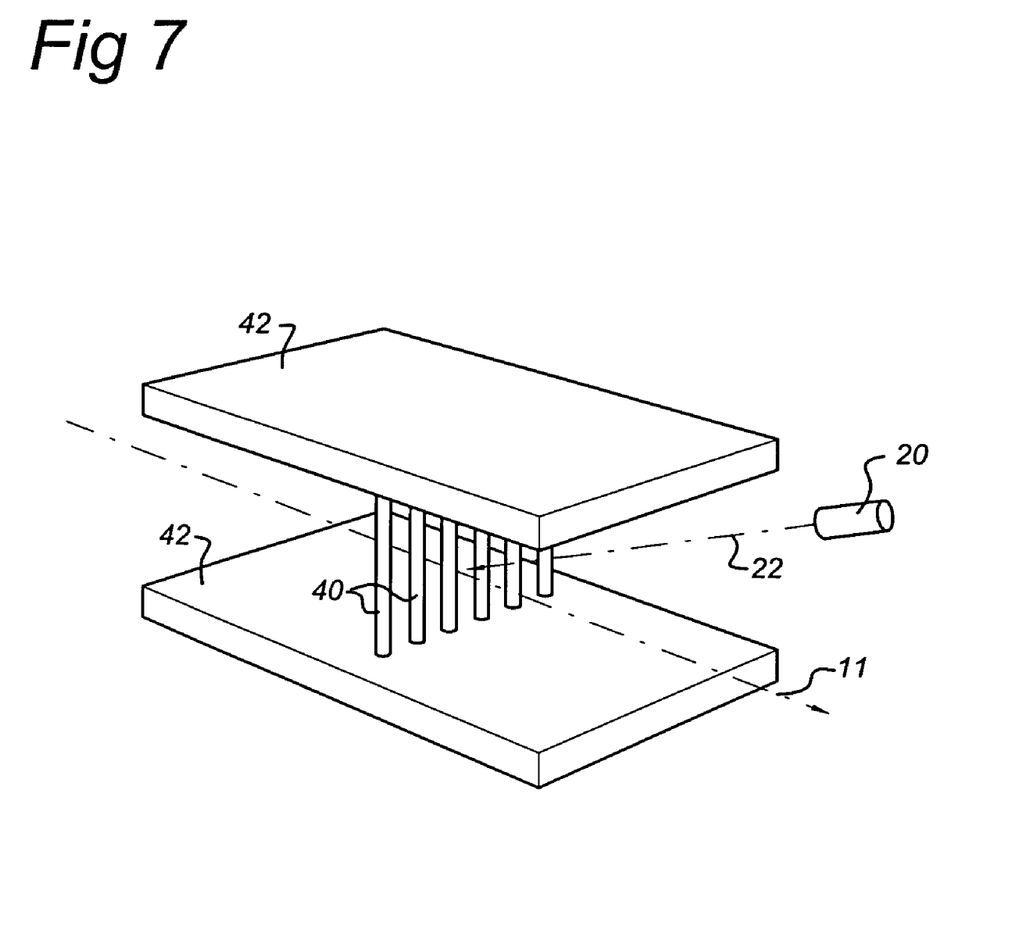
FIG. 7 shows an assembly for blocking a beam of radiation according to a fourth embodiment of the present invention.

FIG. 7 shows an assembly for blocking a beam of radiation according to a fourth embodiment of the present invention. In this embodiment, the ablation material is again ablated by means of a laser 20. However, the beam of radiation is not guided through one or more pipes 1, but between two plates 42. A plurality of parallel wires 40 are provided between the plates 42. At least the surface layer of the plurality of parallel wires 40 comprises ablation material as described with respect to embodiments described earlier in this application. The ablation material may be provided on the plurality by wires 40 by cooling the wires 40 to a suitable temperature and condense the ablation material, which is provided as a vapor by a vapor source (not shown), on its surface. Experiments have shown that a constant gas pressure of about 1 mbar in vicinity of the plurality of wires 40 is suitable to provide a well-defined layer of ablation material. Such a pressure does not yet significantly affect transmissivity of radiation beam 11. Of course, other deposition techniques known to a person skilled in the art may also be applied.

In the embodiment shown in FIG. 7, energy released between the plates 42 as a result of the blocking of radiation, is removed by cooling the plates 42 in a way known to persons skilled in the art. In order to obtain a suitable switching time, the distance between the wires 40 is about 0.01-0.1 cm. The thickness of the wires may be such that at least 80% of the radiation that is projected on the plurality of parallel wires 40, in FIG. 7 depicted by arrow 11, is transmitted. When the laser 20 is activated, laser beam 22 ablates ablation material from the plurality of wires. Suitable ablation materials include ammonia, xenon and tin. A plasma of ablation material expands within a limited period of time and the radiation beam is blocked. The time it takes to block the radiation beam 11 depends on the length of the wires 40.

In an embodiment, the wire material should not only be able to withstand laser ablation, but also be able to withstand a substantial decrease of temperature within a short period of time. Energy generated by the blocking of radiation can then be removed relatively easy. Furthermore, ablation material may condense on the wires 40. Suitable wire materials include diamond type IIa (thermal conductivity of 11700 W/(m·K) at 80 K) and pyrolitic graphite (thermal conductivity of 4500 W/(m·K) at 80 K).

Again, it must be understood, that although not explicitly shown, also the embodiment of an assembly as depicted in FIG. 7, may be used in a plurality of assemblies in a similar way as depicted in FIG. 4 with respect to the assembly of FIG. 3.

Figure 8:
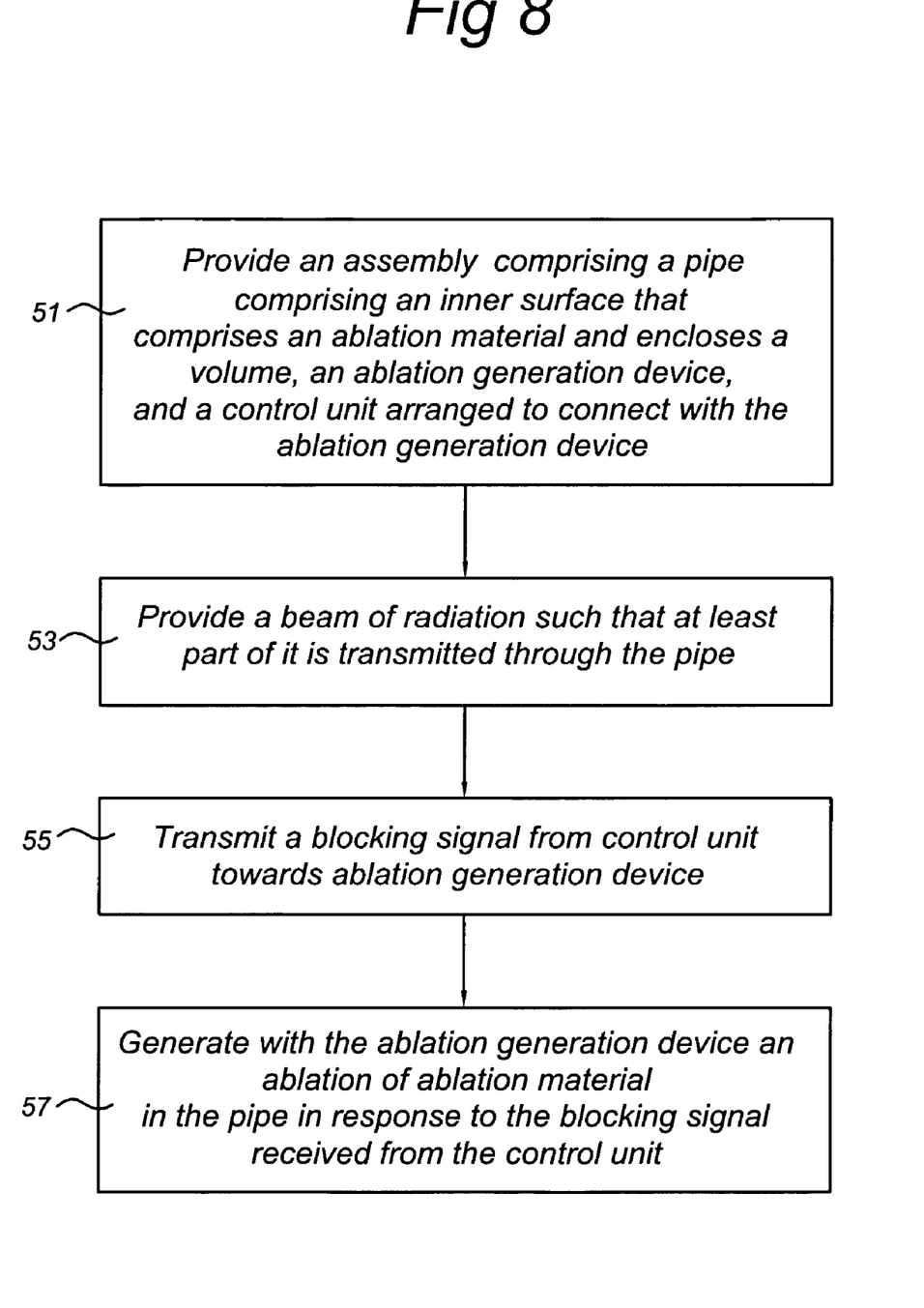
FIG. 8 shows a flow chart depicting a method for blocking a beam of radiation according to a first embodiment of the present invention.

FIG. 8 shows a flow chart depicting a method for blocking a beam of radiation according to a first embodiment of the present invention. In this method, first, in action 51, an assembly is provided. The assembly comprises a pipe, an ablation generation device and a control unit, e.g. assemblies as shown in FIGS. 3, 5 and 6 in which the ablation generation device takes the form of a power supply 3, a laser 20 and a heating device 30 respectively. The pipe comprises an inner surface that comprises an ablation material and encloses a volume. The control unit is connected to the ablation generation device. It comprises a processor and a memory. As earlier, it must be understood that instead of a single assembly, a plurality of assemblies may be arranged. Alternatively, more pipes may be controlled by a single control unit and/or single ablation generation device.

Next, in action 53, a beam of radiation is provided. The orientation of the beam with respect to the assembly is such that at least part of the beam of radiation is arranged to be transmitted through the pipe within the assembly.

Subsequently, in action 55, a blocking signal is transmitted from the control unit towards the ablation generation device. In an embodiment, the control unit transmits the blocking signal within a predetermined period of time, i.e. after waiting a period Δt, as is explained earlier. Such a period Δt may be determined by means of calculating using the processor in the control unit based, the calculation being based on information stored in the memory and/or information provided via an external input as explained earlier with reference processor 13 and memory 15 in FIG. 3.

In response, in action 57, the ablation generation device generates ablation in the pipe in response to the blocking signal received from the control unit. The ablation material in gaseous form in the volume forms a barrier for the beam of radiation trying to proceed through the pipe. If the beam of radiation is EUV radiation or the like, such a barrier will almost immediately be opaque for the radiation. Consequently, for an observer at the end of the pipe through which the radiation normally would leave the pipe the light is suddenly "switched off". The ablation material gas barrier in the pipe thus forms a light switch.

Figure 9:
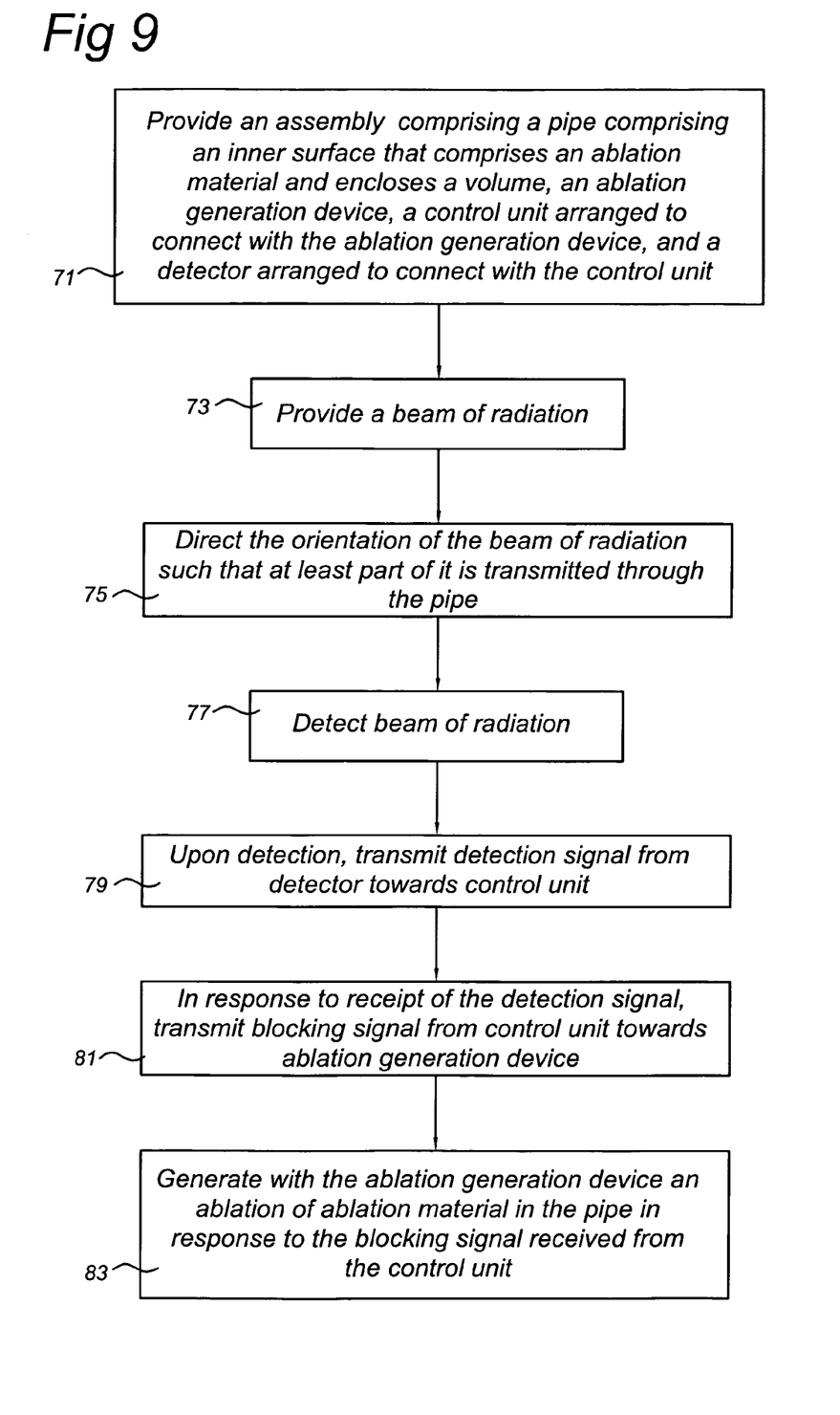
FIG. 9 shows a flow chart depicting a method for blocking a beam of radiation according to a second embodiment of the present invention.

FIG. 9 shows a flow chart depicting a method for blocking a beam of radiation according to a second embodiment of the present invention. First, again, in action 71, an assembly is provided. However, besides a pipe, an ablation generation device and a control unit, the assembly further comprises a detector, e.g. detector 7 in FIGS. 3, 5 and 6. The assembly may be one of the assemblies as shown in FIGS. 3, 5 and 6 in which the ablation generation device takes the form of a power supply 3, a laser 20 and a heating device 30 respectively. The pipe comprises an inner surface that comprises an ablation material and encloses a volume. The control unit is connected to the ablation generation device. It comprises a processor and a memory. Finally, the detector is arranged to transmit a detection signal towards the control unit upon detection of the beam of radiation. As earlier, it must be understood that instead of a single assembly, a plurality of assemblies is arranged. Alternatively, more pipes may be controlled by a single control unit and/or single ablation generation device.

Next, in action 73, the beam of radiation is provided. The beam of radiation has a predetermined pulse length and a predetermined pulse shape.

Subsequently, in action 75, the orientation of the beam is directed in such a way that at least part of the beam of radiation is transmitted through the pipe within the assembly. In case of a plurality of assemblies with a plurality of pipes, the beam of radiation may be split in a number of sub-beams of radiation, each sub-beam corresponding to a certain assembly. In this case, in action 75, each sub-beam is directed in such a way that it is transmitted by the corresponding pipe within the plurality of pipes.

In action 77, the beam of radiation, or in case of a plurality of pipes, the sub-beam of radiation, is detected by the detector.

Upon detection, in action 79, the detector transmits a detection signal towards the control unit.

Subsequently, in action 81, in response to the detection signal received, the control unit may transmit a blocking signal towards the ablation generation device. This operation may be performed by a processor in conjunction with a memory, e.g. processor 13 and memory 15 in control unit 5.

In response, in action 83, the ablation generation device generates ablation in the pipe in response to the blocking signal received from the control unit. The ablation material in gaseous form in the volume forms a barrier for the beam of radiation trying to proceed through the pipe. If the beam of radiation is EUV radiation or the like, such a barrier will almost immediately be opaque for the radiation. Consequently, for an observer at the end of the pipe through which the radiation normally would leave the pipe the light is suddenly "switched off". The ablation material gas barrier in the pipe thus forms a light switch.

If the position of the detector with respect to the pipe, the time for transmitting the blocking signal from the detector towards the control unit, the time for processing of the reception of the blocking signal and corresponding transmitting of the blocking signal towards the power supply, as well as the time it takes for the power supply to generate the ablation material gas barrier are known in advance, a very reliable light switch may be formed. If accurately dimensioned, aforementioned switching time within 30-40 ns for switching an EUV-radiation beam on and off may be reached. Such a performance may enable a control of the number of photons in a beam of radiation being transmitted through pipe.

Figure 10:
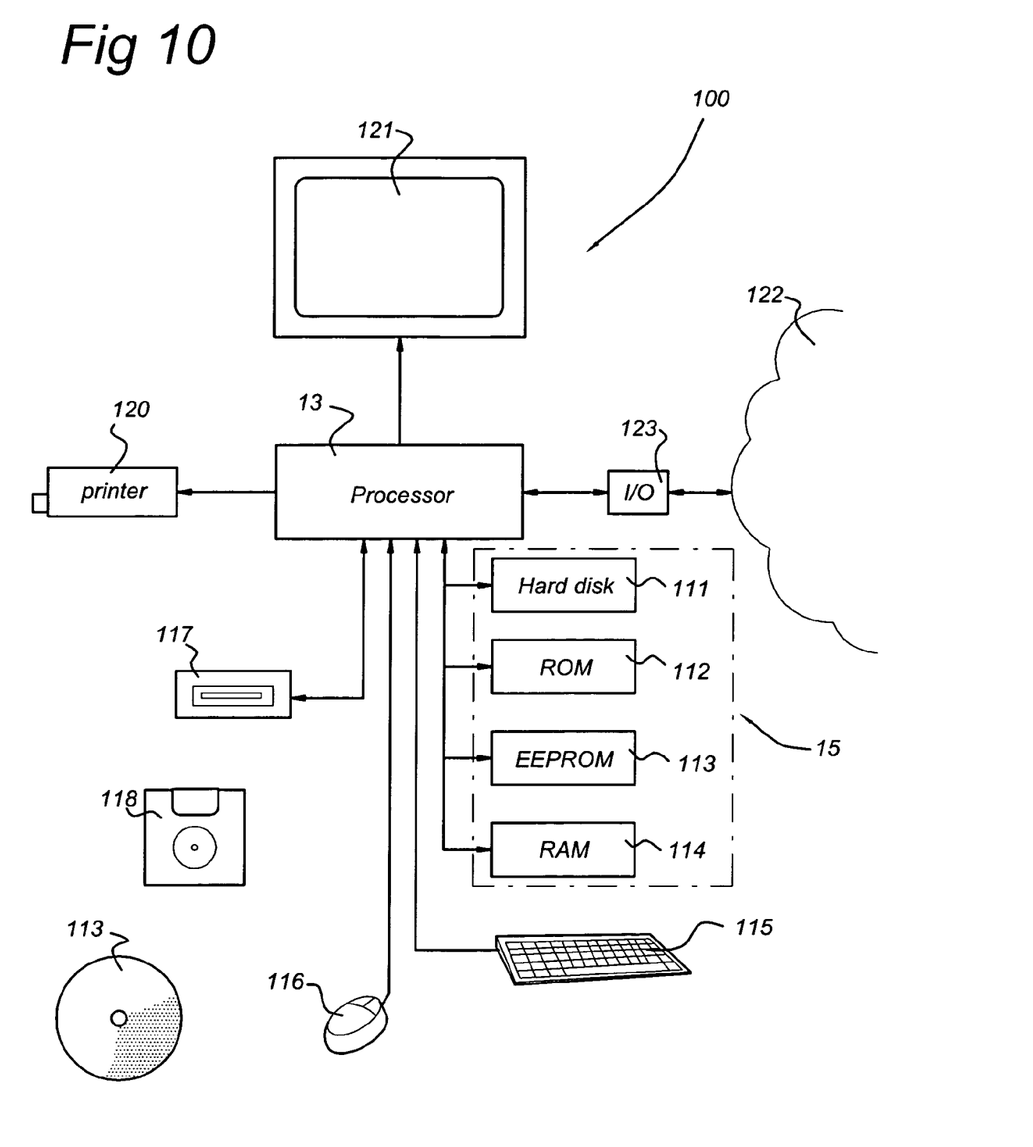
FIG. 10 shows an embodiment of a control unit that may be used by an assembly according to an embodiment of the present invention.

It should be understood that the processor 13 of control unit 5 as used throughout this text can be implemented in a computer assembly 100 as shown in FIG. 10. The computer assembly 100 may be a dedicated computer in the form of control unit 5 in embodiments of the assembly according to the invention or, alternatively, be a central computer controlling the lithographic projection apparatus. The memory 15 connected to processor 13 may comprise a number of memory components like a hard disk 111, Read Only Memory (ROM) 112, Electrically Erasable Programmable Read Only Memory (EEPROM) 113 en Random Access Memory (RAM) 114. Not all aforementioned memory components need to be present. Furthermore, it is not essential that aforementioned memory components are physically in close proximity to the processor 13 or to each other. They may be located at a distance away The processor 13 may also be connected to some kind of user interface, for instance a keyboard 115 or a mouse 116. A touch screen, track ball, speech converter or other interfaces that are known to persons skilled in the art may also be used.

The processor 13 may be connected to a reading unit 117, which is arranged to read data from and under some circumstances store data on a data carrier, like a floppy disc 118 or a CDROM 119. Also DVD's or other data carriers known to persons skilled in the art may be used.

The processor 13 may also be connected to a printer 120 to print out output data on paper as well as to a display 121, for instance a monitor or LCD (Liquid Crystal Display), of any other type of display known to a person skilled in the art.

The processor 13 may be connected to a communications network 122, for instance a public switched telephone network (PSTN), a local area network (LAN), a wide area network (WAN) etc. by means of transmitters/receivers 123 responsible for input/output (I/O). The processor 13 may be arranged to communicate with other communication systems via the communications network 122. In an embodiment of the invention external computers (not shown), for instance personal computers of operators, can log into the processor 13 via the communications network 122.

The processor 13 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 13 may even be located a distance away of the other processing units and communicate via communications network 122.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may have been made above to the complete blocking of a beam of radiation in a pipe as a consequence of ablation of ablation material in response to a blocking signal, it must be understood that similar provisions may be made to change the transmissivity of the volume in the pipe for the beam of radiation. For example, the cross-sectional dimensions of the pipe may be such that ablation of ablation material results in a 20% decrease of radiation intensity.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An assembly for blocking a beam of radiation, the assembly comprising:
   a pipe arranged to transmit at least part of said beam of radiation along a longitudinal axis of said pipe, said pipe comprising an inner surface, said inner surface comprising an ablation material and enclosing a volume;
   an ablation generation device arranged to ablate at least a portion of said ablation material upon reception of a blocking signal; and
   a control unit arranged to control said ablation generation device.

2. An assembly according to claim 1, wherein said assembly further comprises a detector arranged to detect said beam of radiation at a predetermined location with respect to said pipe, and said detector, upon detection of said beam of radiation, is arranged to generate a detection signal and to transmit said detection signal towards said control unit, said control unit being arranged to transmit said blocking signal within a predetermined period of time from receiving said detection signal.

3. An assembly according to claim 1, wherein said ablation generation device comprises a cathode-anode combination.

4. An assembly according to claim 1, wherein said ablation generation device comprises a laser arranged to direct a laser beam towards a location on said inner surface of said pipe.

5. An assembly according to claim 1, wherein said ablation generation device comprises a heat generator arranged in close proximity of the inner surface of said pipe.

6. An assembly according to claim 1, wherein said volume is at least partly filled with a gas.

7. An assembly according to claim 6, wherein said gas is selected from a group comprising helium, argon, hydrogen, and nitrogen.

8. An assembly according to claim 1, wherein said ablation material is selected from a group comprising solid ammonia, xenon, tin and zinc.

9. An arrangement comprising a plurality of assemblies according to claim 1, wherein said assemblies are arranged in a matrix format.

10. An arrangement according to claim 9, wherein said plurality of assemblies comprises at least two assemblies sharing the same ablation generation device, said shared ablation generation device being connected to a single control unit.

11. An arrangement according to claim 9, wherein each assembly within said plurality of assemblies is individually controlled by a control unit.

12. An arrangement according to claim 11, wherein said control unit is a single control unit.

13. An arrangement according to claim 12, wherein said single control unit comprises a memory in which a device layout is stored, and said single control unit is arranged to individually control said plurality of assemblies based on said device layout.

14. A lithographic apparatus comprising:
an illumination system configured to provide a beam of radiation;
a support structure configured to support a patterning device that serves to impart said beam of radiation with a pattern in its cross-section;
a substrate holder configured to hold a substrate; and
a projection system configured to expose said patterned beam on said substrate, wherein said lithographic apparatus further comprises at least one assembly according to claim 1.

15. A lithographic apparatus according to claim 14 wherein said radiation is EUV-radiation.

16. A lithographic apparatus comprising:
an illumination system configured to provide a beam of radiation;
an arrangement comprising a plurality of assemblies according to claim 1, the assemblies being arranged in a matrix format configured to impart said beam of radiation with a pattern in its cross-section;
a substrate holder configured to hold a substrate; and
a projection system configured to expose said patterned beam on said substrate.

17. A method of blocking a beam of radiation, the method comprising:
providing an assembly comprising a pipe comprising an inner surface that comprises an ablation material and encloses a volume, an ablation generation device, and a control unit arranged to connect with the ablation generation device;
providing a beam of radiation such that at least part of it is transmitted through the pipe along a longitudinal axis of said pipe;
transmitting a blocking signal from said control unit towards said ablation generation device; and
generating ablation of said ablation material in said pipe by said ablation generation device in response to said blocking signal received from said control unit.

18. A method according to claim 17, wherein the assembly further comprises a detector arranged to connect with said control unit, and the method further comprises, after said providing a beam of radiation:
detecting said beam of radiation by said detector;
transmitting, upon detecting, a detection signal from said detector towards said control unit; and
transmitting the blocking signal by said control unit towards said ablation generation device in response to receipt of said detection signal.

19. A method according to claim 18, wherein said transmitting the blocking signal towards the ablation generation device is performed after a predetermined time, and the method further includes calculating said predetermined time based on parameters of said beam of radiation.

20. A method according to claim 18, wherein said transmitting the blocking signal towards the ablation generation device is performed after a predetermined time, and the method further includes calculating said predetermined time based on parameters of said beam of radiation including at least one of the group comprising pulse length and pulse shape.

21. A computer-readable medium encoded with a computer program product for performing, when executed by a processor, the method of claim 18.

22. An assembly for blocking a beam of EUV-radiation with a predetermined pulse length and pulse shape, the assembly comprising:
a pipe arranged to accommodate at least part of said beam of radiation, said pipe comprising an inner surface, said inner surface comprising an ablation material and enclosing a volume;
a detector arranged to detect said beam of radiation at a predetermined location in said pipe;
a cathode-anode combination arranged to ablate said ablation material; and
a control unit arranged to control said ablation generation device, wherein, upon detection of said beam of EUV-radiation by said detector, said detector generates a detection signal that is transmitted towards said control unit, said control unit arranged to transmit after a certain period of time a blocking signal towards said ablation generation device.

* * * * *